(12) United States Patent
Han et al.

(10) Patent No.: US 8,212,265 B2
(45) Date of Patent: Jul. 3, 2012

(54) LIGHT EMITTING DEVICE AND METHOD FOR FABRICATING THE LIGHT EMITTING DEVICE

(75) Inventors: Dae Seob Han, Seoul (KR); Yong Tae Moon, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 0 days.

(21) Appl. No.: 13/192,985

(22) Filed: Jul. 28, 2011

(65) Prior Publication Data

US 2011/0291127 A1 Dec. 1, 2011

(30) Foreign Application Priority Data

Nov. 19, 2010 (KR) .................. 10-2010-0115695

(51) Int. Cl.
*H01L 27/15* (2006.01)
*H01L 29/167* (2006.01)
*H01L 31/12* (2006.01)
*H01L 33/00* (2010.01)

(52) U.S. Cl. ............. 257/86; 257/21; 257/79; 257/88; 257/184; 257/228; 257/431; 257/E33.001; 257/E51.018; 257/E25.032

(58) Field of Classification Search .......... 257/21, 257/79, 86, 88, 184, 228, 431, E33.001, E51.018, 257/E25.032
See application file for complete search history.

(56) References Cited

U.S. PATENT DOCUMENTS

| 8,030,673 B2* | 10/2011 | Ubahara | 257/96 |
| 2008/0149917 A1* | 6/2008 | Park | 257/17 |
| 2010/0148651 A1* | 6/2010 | Scott | 313/1 |

FOREIGN PATENT DOCUMENTS

| JP | 2003-046200 | 2/2003 |
| JP | 2008-034848 | 2/2008 |
| KR | 1020060036713 | 5/2006 |
| KR | 100604406 | 7/2006 |
| KR | 100887050 | 2/2009 |
| KR | 1020090072444 | 7/2009 |
| KR | 1020100089635 | 8/2010 |

\* cited by examiner

*Primary Examiner* — Michelle Mandala
(74) *Attorney, Agent, or Firm* — Lowe Hauptman Ham & Berner, LLP

(57) ABSTRACT

Disclosed is a light emitting device including, a light emitting structure that has a first conductive semiconductor layer, an active layer and a second conductive semiconductor layer, wherein the active layer is provided between the first conductive semiconductor layer and the second conductive semiconductor layer, and includes a plurality of well layers and at least one barrier layer, wherein the barrier layer includes a first nitride layer and a second nitride layer provided on the first nitride layer, and wherein the first nitride layer has a larger energy band gap than the second nitride layer while the energy band gap of the second nitride layer is larger than that of each well layer.

20 Claims, 10 Drawing Sheets

Laser

LIGHT EMITTING DEVICE AND METHOD FOR FABRICATING THE LIGHT EMITTING DEVICE

This application claims the benefit of Korean Patent Application No. 2010-0115695, filed on Nov. 19, 2010, which is hereby incorporated by reference as if fully set forth herein.

BACKGROUND OF THE INVENTION

1. Field of the Invention

Embodiments of the present invention relate to a light emitting device with improved luminous efficacy by reducing leakage current in an active layer to improve internal quantum efficiency, and a method for fabricating the same.

2. Discussion of the Related Art

A light emitting device such as a light emitting diode using Group III-V semiconductors or Group II-VI semiconductors, a laser diode, etc., may realize various colors including, for example, red, green, blue and/or UV, as a result of developing thin film growth technologies and device materials. Also, using fluorescent materials or combination of colors may realize high efficiency white light and attain advantages including, for example, low power consumption, semi-indefinite lifespan, rapid response, safety, eco-friendliness, or the like, compared to existing light sources such as a fluorescent lamp, an incandescent lamp, etc.

Accordingly, the foregoing light emitting device is now being applied to various applications such as a transmission module of an optical network device, a light emitting diode backlight capable of replacing a cold cathode fluorescent lamp (CCFL) to compose a backlight of a liquid crystal display (LCD), a white light emitting device lighting instrument capable of replacing a fluorescent lamp or incandescent bulb, a headlight of a vehicle, a traffic light, and so forth, and a range of such applications continues to expand.

SUMMARY OF THE INVENTION

Embodiments of the present invention are directed to reduce leakage current in an active layer and improve internal quantum efficiency, thereby enhancing luminous efficacy of a light emitting device.

Therefore, according to one embodiment, there is provided a light emitting device including a light emitting structure that has a first conductive semiconductor layer, an active layer and a second conductive semiconductor layer, wherein the active layer is provided between the first conductive semiconductor layer and the second semiconductor layer, includes a plurality of well layers and at least one barrier layer, wherein the barrier layer is formed to have a first nitride layer and a second nitride layer provided on the first nitride layer, and wherein the first nitride layer has a larger energy gap than the second nitride layer while the energy gap of the second nitride layer is larger than that of each well layer.

Another embodiment provides a light emitting device including a light emitting structure that has a first conductive semiconductor layer, an active layer and a second conductive semiconductor layer, wherein the active layer is provided between the first conductive semiconductor layer and the second semiconductor layer, includes a plurality of well layers and at least one carrier cooling layer, wherein the carrier cooling layer has a first nitride layer and a second nitride layer provided adjacent to the first nitride layer, and wherein the first nitride layer has a larger energy gap than the second nitride layer while the energy gap of the second nitride layer is larger than that of each well layer.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Figure 1A:
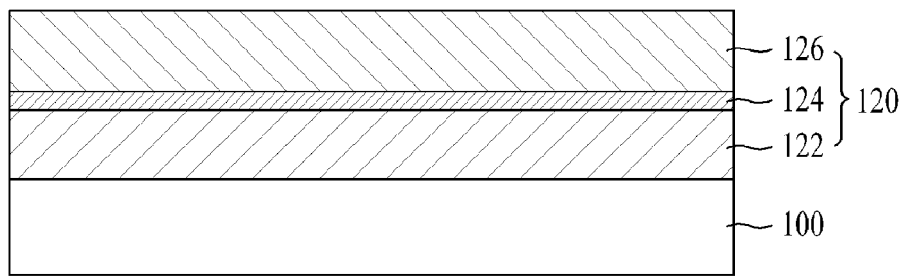
FIGS. 1A to 1G illustrate a process of fabricating a light emitting device according to one embodiment of the present invention.

Hereinafter, with reference to the accompanying drawings, preferred embodiments will be described in detail.

Prior to description of the embodiments, it will be understood that when an element such as a layer (film), region, pattern, or structure is referred to as being formed "on" or "under" another element, such as a substrate, layer (film), region, pad, or pattern, it can be directly "on" or "under" the other element or be indirectly formed with intervening elements therebetween. Further, "on" or "under" will be described based on illustration in the drawings.

In the drawings, thicknesses and/or sizes of respective layers may be enlarged, omitted or schematically illustrated for convenience of explanation or clarity. In addition, sizes of respective elements may not entirely reflect the real size thereof.

FIGS. 1A to 1G illustrate a process of fabricating a light emitting device according to one embodiment of the present invention.

Referring to FIG. 1A, a substrate 100 is prepared. The substrate 100 may be a conductive substrate or an insulating substrate and, for example, be formed using any one selected from sapphire ($Al_2O_3$), SiC, Si, GaAs, GaN, ZnO, GaP, InP, Ge and $Ga_2O_3$. The substrate may have an uneven structure (or irregularities) formed thereon, without being particularly limited thereto. Foreign impurities on the surface thereof may be removed by wet washing.

A light emitting structure 120 comprising a first conductive semiconductor layer 122, an active layer 124 and a second conductive semiconductor layer 126 may be formed on the substrate 100.

In this regard, a buffer layer (not shown) may be grown between the substrate 100 and the light emitting structure 120, in order to reduce lattice mismatch and/or a difference in thermal expansion coefficient between materials. The buffer layer may be formed using Group III-V semiconductor materials, for example, at least one selected from GaN, InN, AlN, InGaN, AlGaN, InAlGaN, AlInN, etc., without being particularly limited thereto. An undoped semiconductor layer may be provided above the buffer layer, without being particularly limited thereto.

The light emitting structure 120 may be fabricated by conventional methods, for example; metal organic chemical vapor deposition (MOCVD), chemical vapor deposition (CVD), plasma-enhanced chemical vapor deposition (PECVD), molecular beam epitaxy (MBE), hydride vapor phase epitaxy (HVPE), and so forth, however, the method is not particularly limited thereto.

The first conductive semiconductor layer may be realized using Group III-V semiconductors and have a first conductive dopant doped thereon. If the first conductive semiconductor layer 122 is an N-type semiconductor layer, the first conductive dopant may comprise an N-type dopant, such as Ge, Sn, Se and/or Te, without being particularly limited thereto.

The first conductive semiconductor layer 122 may comprise a semiconductor material represented by the formula of $Al_xIn_yGa_{(1-x-y)}N$ ($0 \leq x \leq 1$, $0 \leq y \leq 1$, $0 \leq x+y \leq 1$). For instance, at least one selected from a group consisting of GaN, InN, AlN, InGaN, AlGaN, InAlGaN, AlInN, AlGaAs, InGaAs, AlInGaAs, GaP, AlGaP, InGaP, AlInGaP, InP, etc. may be used.

The first conductive semiconductor layer 122 may be formed by injecting trimethyl gallium gas (TMGa), ammonia gas ($NH_3$), nitrogen gas ($N_2$), and/or silane gas ($SiH_4$) containing n-type impurities such as Si into a chamber.

The active layer 124 may be a layer to emit light that has energy determined by the inherent energy band of an active layer (light emitting layer) material, after when carriers injected through the first conductive semiconductor layer 122 and the second conductive semiconductor layer 126, respectively, are combined.

The active layer 124 may be formed in at least one among a single or multi-quantum well structure (MQW), a quantum-wire structure or a quantum dot structure. For instance, the foregoing active layer 124 may have an MQW formed by injecting trimethyl gallium gas (TMGa), ammonia gas ($NH_3$), nitrogen gas ($N_2$), trimethyl indium gas (TMIn) therein, without being particularly limited thereto.

A well layer/barrier layer of the active layer 124 may be formed in at least one pair of structures selected from InGaN/GaN, InGaN/InGaN, GaN/AlGaN, InAlGaN/GaN, GaAs(InGaAs)/AlGaAs or GaP(InGaP)/AlGaP, without being particularly limited thereto. Such well layer may comprise a material having a smaller band gap than the barrier layer.

The active layer 124 according to one embodiment may have an MQW and include a plurality of well layer and at least one barrier layer.

In this regard, a first nitride layer for the barrier layer may have a larger energy band gap than a second nitride layer formed on the first nitride layer, and the second nitride layer may have a larger energy band gap than each well layer. That is, the active layer may have a technical configuration wherein the energy band gap of a nitride layer in a barrier layer is sequentially (gradually) narrowed from a first conductive semiconductor layer to a second conductive semiconductor layer. Accordingly, the energy of electrons having high kinetic energy injected into the barrier layer may be decreased stepwise. Owing to such effects, the barrier layer may be referred to as a carrier cooling quantum barrier.

A carrier cooling layer having the same configuration as of the barrier layer may be provided on top of the first conductive semiconductor layer, such that the energy band gap is sequentially narrowed before electrons injected from the first conductive semiconductor layer enter the well layer.

Here, a nitride layer in the barrier layer may be composed of multiple layers having different energy steps (or energy levels), an energy difference between the energy steps may be not less than an energy level of a longitudinal optical phonon ($\hbar\omega_{LO}$).

Phonons generated by solid lattice vibration may be classified into longitudinal optical phonons ($\hbar\omega_{LO}$) and transverse optical phonons ($\hbar\omega_{TO}$). For Group III-V semiconductor materials, physical reaction of the transverse optical phonons ($\hbar\omega_{TO}$) with electrons occurs at a relatively lower probability, compared to the longitudinal optical phonons ($\hbar\omega_{LO}$). Therefore, when considering scattering and/or absorption of electrons and phonon in regard to Group III-V semiconductors, the longitudinal optical phonons ($\hbar\omega_{LO}$) only will be described while disregarding the transverse optical phonons ($\hbar\omega_{TO}$).

In general, a semiconductor layer formed of InGaN may include a longitudinal optical phonon ($\hbar\omega_{LO}$) having an energy level of 74 to 84 meV depending upon indium (In) content. Accordingly, an energy difference between multiple steps of the nitride layers may be at least 74 meV.

According to the inventive embodiments, a thickness of a barrier layer is sufficiently small and designed in the range of 1 to 5 nm, so that a hole reaches even a well layer far from a second conductive semiconductor layer, on the basis of a tunneling phenomenon. Moreover, uncooled electrons tunnel through the barrier layer and are cooled, thus being changed into electrons having lower energy and easily confined within the well layer. Consequently, the recombination rate of electrons and holes may be improved.

Accordingly, when high current is applied to the active layer 124, electrons having high kinetic energy pass through the carrier cooling layer and are cooled stepwise, thereafter being injected into a first well layer and recombining with holes in the well layer. Cooled but un-recombined electrons again tunnel through the barrier layer and then are injected into a second well layer.

In this case, other electrons having high kinetic energy may also pass through the barrier layer and be cooled, and then, injected into the next well layer.

As such, according to the inventive embodiments, the electrons having high kinetic energy are changed into a cooled state having relatively low energy while passing through the barrier layer and the carrier cooling layer, in turn being confined within the well layer. Therefore, the confined electrons may recombine with holes, thus easily emitting light.

Furthermore, a probability of electrons flowing toward the second conductive semiconductor layer 126 without recombination with holes may be decreased, thereby efficiently preventing leakage current.

Above and/or under the active layer 124, a conductive clad layer (not shown) may be provided. The conductive clad layer may be composed of AlGaN semiconductors and have a higher band gap than the active layer 124.

The second conductive semiconductor layer 126 may comprise Group III-V semiconductors doped with a second conductive dopant, for example, semiconductor materials represented by the formula of $In_xAl_yGa_{1-x-y}N$ ($0 \leq x \leq 1$, $0 \leq y \leq 1$, $0 \leq x+y \leq 1$). If the second conductive semiconductor layer 126 is a p-type semiconductor layer, the second conductive semiconductor dopant may be a p-type dopant such as Mg, Zn, Ca, Sr and Ba.

For the second conductive semiconductor layer 126, a p-type GaN layer may be formed by injecting trimethyl gallium gas (TMGa), ammonia gas ($NH_3$), nitrogen gas ($N_2$), and/or bicetylcyclopentadienyl magnesium containing p-type impurities such as Mg ($EtCp_2Mg\{Mg(C_2H_5C_5H_4)_2\}$ into a chamber, without being particularly limited thereto.

According to the inventive embodiments, the first conductive semiconductor layer 122 may be a p-type semiconductor layer while realizing the second conductive semiconductor layer 126 into an n-type semiconductor layer. Alternatively, another semiconductor layer having polarity opposite to the second conductive semiconductor layer 126 may be arranged above the second conductive semiconductor layer and, for instance, if the second conductive semiconductor layer is a p-type semiconductor layer, the above semiconductor layer may be an n-type semiconductor layer (not shown). Accordingly, the light emitting structure 120 may be realized as one of N-P, P-N, N-P-N and P-N-P junction structures.

Figure 1B:
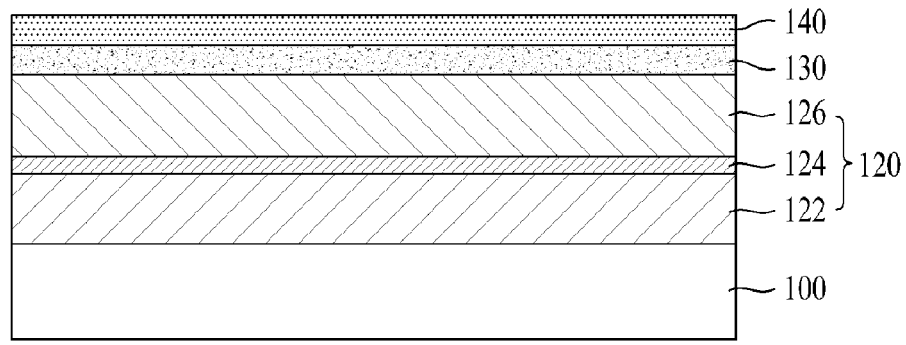

As shown in FIG. 1B, an ohmic layer 130 may be laminated to a thickness of about 200 Å on the second conductive semiconductor layer 126.

The ohmic layer 130 may selectively comprise a light transmitting conductive layer and metals, for example, include at least one selected from; indium tin oxide (ITO), indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), gallium zinc oxide (GZO), IZO nitride (IZON), Al—Ga ZnO (AGZO), In—Ga ZnO (IGZO), ZnO, IrOx, RuOx, NiO, RuOx/ITO, Ni/IrOx/Au, Ni/IrOx/Au/ITO, Ag, Ni, Cr, Ti, Al, Rh, Pd, Ir, Sn, In, Ru, Mg, Zn, Pt, Au, Hf, etc., without being particularly limited thereto. The ohmic layer 130 may be formed by sputtering or electron beam deposition.

On the ohmic layer 130, a reflective layer 140 may be provided to a thickness of about 2500 Å. The reflective layer 140 may be formed using metals, for example, at least one selected from Ag, Ni, Al, Rh, Pd, Ir, Ru, Mg, Zn, Pt, Au and Hf, or alloys thereof. Alternatively, the reflective layer may be formed in a multi-layer structure using the metals and/or alloys described above and a light-transmitting material such as IZO, IZTO, IAZO, IGZO, IGTO, AZO, and ATO. More particularly, the reflective layer may be laminated in a structure such as IZO/Ni, AZO/Ag, IZO/Ag/Ni or AZO/Ag/Ni. Aluminum or silver may effectively reflect light emitted from the active layer 124, to thereby remarkably improve light extraction efficiency of the light emitting device. When the reflective layer 140 is made of a material enabling ohmic contact to a light emitting structure, the ohmic layer 130 may be omitted, without being particularly limited thereto.

Figure 1C:
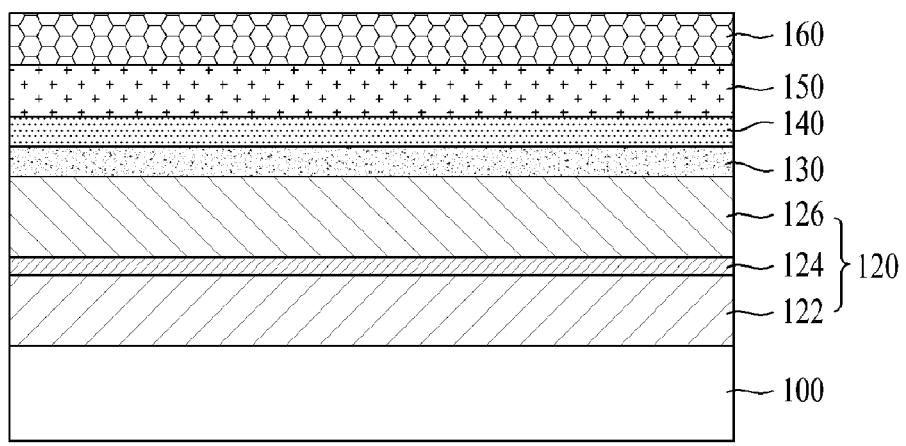

As shown in FIG. 1C, a conductive support substrate 160 may be provided on the reflective layer.

The conductive support substrate 160 may comprise a material selected from a group consisting of molybdenum (Mo), silicon (Si), tungsten (W), copper (Cu) and aluminum (Al) or alloys thereof, and may optionally include gold (Au), copper alloys (Cu alloy), nickel (Ni), copper-tungsten (Cu—W), a carrier wafer (e.g., GaN, Si, Ge, GaAs, ZnO, SiGe, SiC, SiGe, $Ga_2O_3$, etc.), or the like. The conductive support substrate 160 may be formed by electro-chemical metal deposition, metal eutectic bonding, etc.

In this regard, in order to combine the reflective layer 140 with the conductive support substrate 160, the reflective layer 140 may serve as a bonding layer or, otherwise, an alternative bonding layer 150 may be formed using a material selected from a group consisting of gold (Au), tin (Sn), indium (In), aluminum (Al), silicon (Si), silver (Ag), nickel (Ni) and copper (Cu) or alloys thereof.

Figure 1D:
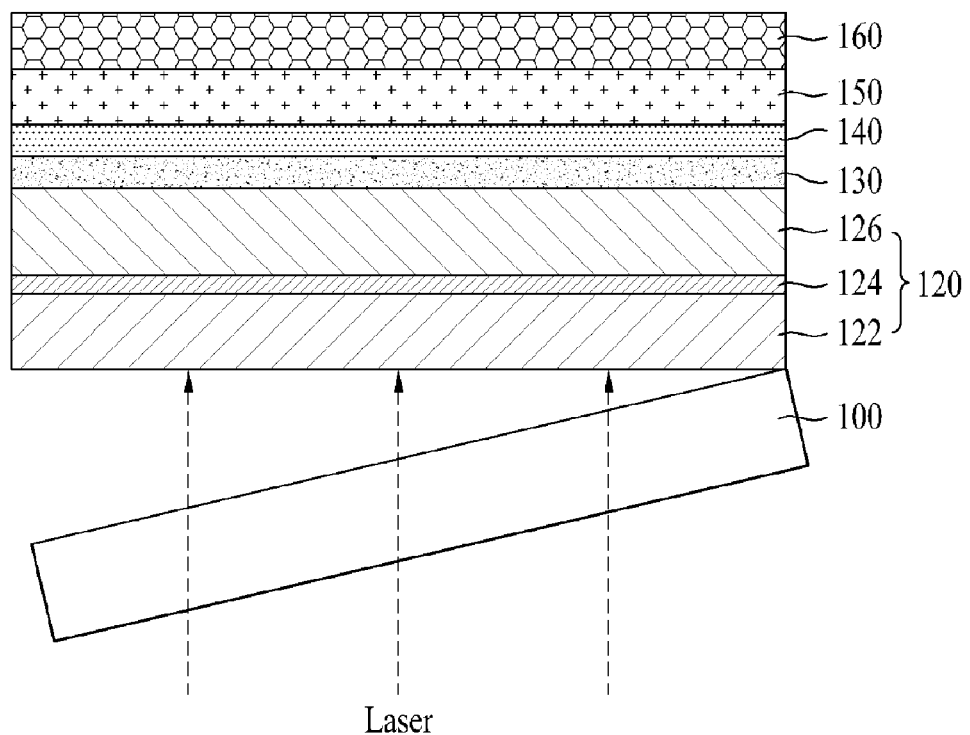

Then, as shown in FIG. 1D, the substrate 100 is separated.

Removal of the substrate 100 may be conducted by a laser lift-off method (LLO) using an excimer laser, or dry or wet etching.

For instance, LLO may include focusing and emitting an excimer laser having a predetermined range of wavelengths to concentrate thermal energy (heat) at a boundary between the substrate 100 and the light emitting structure 120, thereby enabling flash separation of the substrate 100 at a site, through which the laser passes, while separating the boundary into gallium and nitrogen molecules.

Figure 1E:
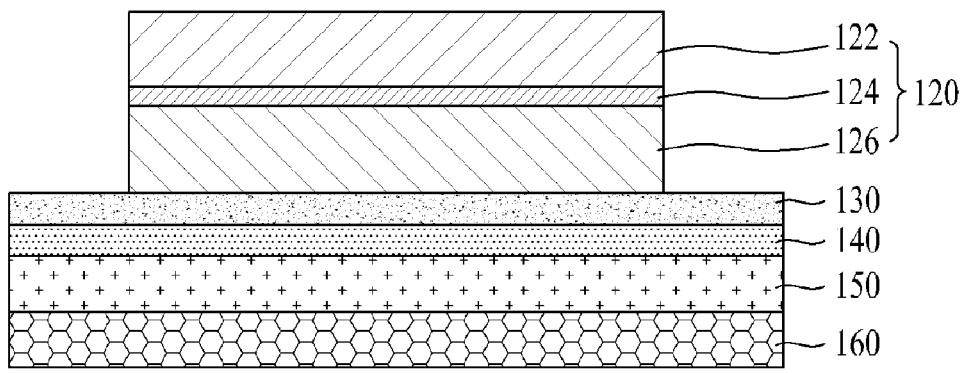

As shown in FIG. 1E, a lateral surface of the light emitting structure 120 is etched.

Figure 1F:
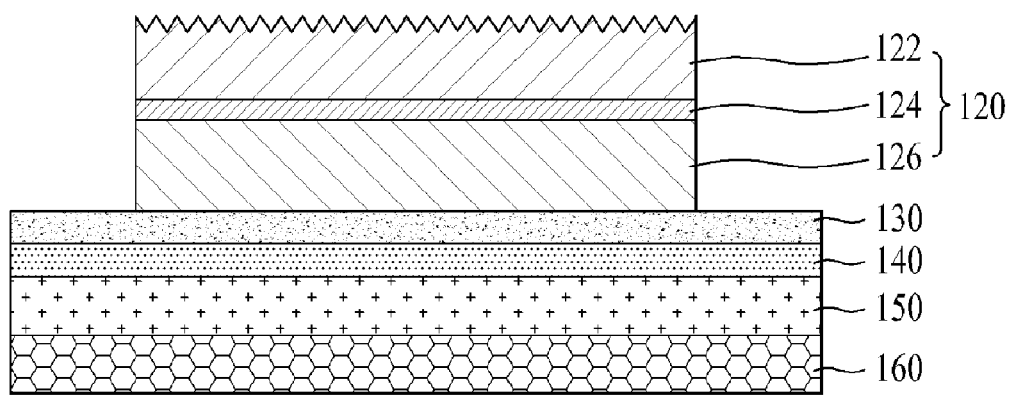

As shown in FIG. 1F, an uneven (rough) structure may be formed on the first conductive semiconductor layer 122. Here, the uneven structure may be formed by a PEC process or etching after preparation of a mask.

In such PEC method, by adjusting an amount of etching solution (i.e., KOH) and/or a difference in etching rate based on GaN crystallinity, a shape of fine unevenness may be varied. Such unevenness may be periodically or non-periodically formed. According to the inventive embodiments, in order to increase a light reflective rate, a region on which a first electrode is provided may not undergo PEC etching using a mask, thus not forming unevenness thereon.

Figure 1G:
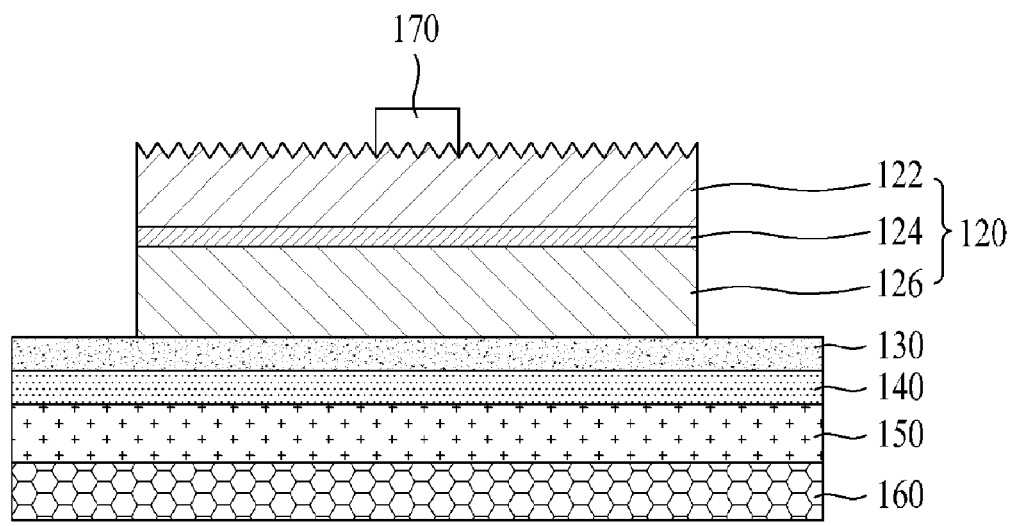

As shown in FIG. 1G, a first electrode 170 may be formed on the surface of the first conductive semiconductor layer. The first electrode 170 may comprise, for example, at least one metal selected from molybdenum (Mo), chromium (Cr), nickel (Ni), gold (Au), aluminum (Al), titanium (Ti), platinum (Pt), vanadium (V), tungsten (W), lead (Pb), copper (Cu), rhodium (Rh) and iridium (Ir), or alloys thereof. The first electrode 170 may also be formed using a mask, to be present on a part of the first conductive semiconductor layer 122.

Figure 2:
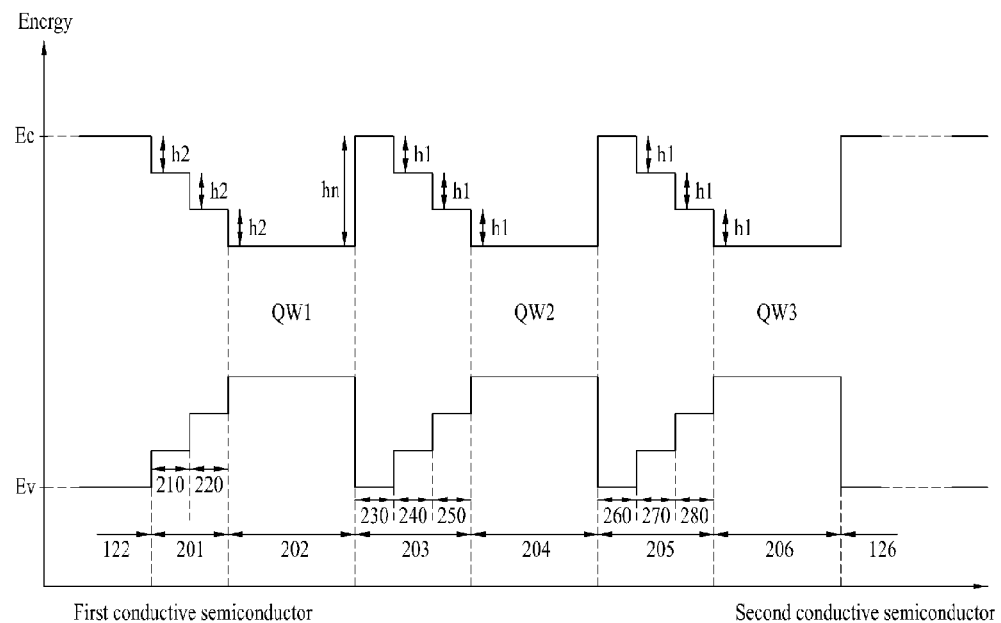
FIG. 2 illustrates an energy band diagram of an active layer in a light emitting device according to one embodiment of the present invention.

FIG. 2 illustrates an energy band diagram of an active layer in a light emitting device according to one embodiment of the present invention.

Referring to FIG. 2, the light emitting device may include a first conductive semiconductor layer 122, an active layer 124 and a second conductive semiconductor layer 126. The active layer 124 may have a carrier cooling layer 201, a first well layer 202, a first barrier layer 203, a second well layer 204, a second barrier layer 205 and a third well layer 206. According to the inventive embodiments, the barrier layer and well layer may be provided in plural and the number of layers is not particularly limited.

The carrier cooling layer 201 in the active layer 124 may allow an energy band gap to be sequentially narrowed before electrons injected from the first conductive semiconductor layer 122 enter the well layer, thus decreasing the energy of the electrons.

The electrons passing through the carrier cooling layer 201 may enter the first well layer 202 and then recombine with holes injected from the second conductive semiconductor layer 126, thus emitting light.

In this case, the carrier cooling layer 201 may consist of a plurality of layers having different energy steps and an energy difference between such energy steps may be equal to or higher than an energy level of a longitudinal optical phonon ($\hbar\omega_{LO}$).

The cooled electrons in the first well layer 202 may recombine with holes. The remaining cooled electrons without recombination with the holes tunnel through the first barrier layer 203 in the active layer 124, and then, enter the second well layer 204. According to the inventive embodiments, since a thickness of the first barrier layer 203 is sufficiently small and designed in the range of 1 to 5 nm, non-recombined electrons may be injected into the second well layer 204 through tunneling.

An energy level of the first barrier layer 203 ($h_n = nh_1$, wherein n is the number of nitride layers and $h_1$ denotes an energy difference in respective energy steps of the nitride layer) is equal to or higher than $3K_BT$, thus preventing electrons or holes from escaping the first well layer 202 by heat, instead of tunneling.

Since the first barrier layer 203 in the active layer 124 according to the inventive embodiment serves to sequentially decrease the energy of electrons, incompletely cooled electrons pass through the first barrier layer 203 and are changed into a cooled state having low energy, in turn being injected into the second well layer 204.

In other words, electrons passed through the first well layer 202 but still having high kinetic energy may again pass through the first barrier layer 203 composed of multiple steps and be cooled stepwise, in turn recombining with holes in the second well layer 204.

Likewise, the remaining cooled electrons without recombination with the holes in the second well layer 204 may tunnel through the second barrier layer 205 in the active layer 124, in turn being injected into the third well layer 206. According to the inventive embodiments, since a thickness of the second barrier layer 205 is sufficiently small and designed in the range of 1 to 5 nm, non-recombined electrons may be injected into the third well layer 206 through tunneling.

Similarly, since the second barrier layer 205 in the active layer 124 according to the inventive embodiment serves to sequentially decrease the energy of electrons, incompletely cooled electrons pass through the second barrier layer 205 and are cooled, in turn being injected into the third well layer 206.

That is, electrons having passed through the first well layer 202 and second well layer 204 but still having high kinetic energy may again pass through the second barrier layer 205 composed of multiple steps and be cooled stepwise, in turn recombining with holes in the third well layer 206.

Therefore, according to the inventive embodiments, when high current is applied to the active layer 124, electrons having high kinetic energy may be cooled stepwise while passing through the carrier cooling layer 201, and then, injected into the first well layer 202 and recombine with holes. The remaining cooled electrons without recombination with holes in the first well layer 202 may tunnel again through the first well layer 203 and be injected into the second well layer 204.

In this regard, the electrons still having high kinetic energy are cooled while passing through the first barrier layer 203 and are then injected into the second well layer 204. Likewise, the remaining cooled electrons without recombination with the holes in the second well layer 204 may tunnel again through the second barrier layer 205, in turn being injected into the third well layer 206. Here, the electrons still having high kinetic energy may also be cooled while passing through the second barrier layer 205, and then, injected into the third well layer 206.

According to the inventive embodiments, since the electrons having high kinetic energy are cooled while passing through the carrier cooling layer 201 and barrier layers 203 and 205, and recombine with holes, thus emitting light. As a result, a probability of electrons flowing toward the second conductive semiconductor layer 126 without recombination with holes may be decreased, thereby reducing leakage current while improving internal quantum efficiency of the active layer.

According to the inventive embodiments, since a thickness of each of the barrier layers 203 and 205 is sufficiently small and designed in the range of 1 to 5 nm, holes as well as electrons may even reach the first well layer 202 far from the second conductive semiconductor layer 126 through tunneling, thereby increasing a (radiative) recombination rate.

Figure 3:
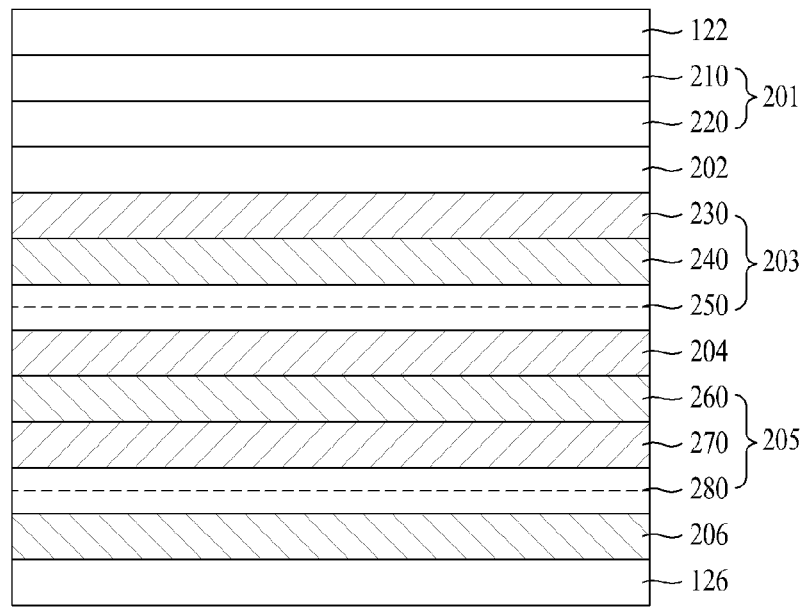
FIG. 3 illustrates an active layer of a light emitting device according to one embodiment of the present invention.

FIG. 3 illustrates an active layer of a light emitting device according to one embodiment of the present invention.

Referring to FIG. 3, the light emitting device may include a first conductive semiconductor layer 122, a plurality of active layers 201 to 206 and a second conductive semiconductor layer 126. The active layers 201 to 206 may have a carrier cooling layer 201, a first well layer 202, a first barrier layer 203, a second well layer 204, a second barrier layer 205 and a third well layer 206. According to the inventive embodiments, the barrier layer and well layer may be provided in plural and the number of layers is not particularly limited.

The carrier cooling layer 201 may consist of multiple nitride layers 210, 220, etc. having respective energy steps, and an energy difference between the energy steps may be equal to or higher than an energy level of a longitudinal optical phonon ($\hbar\omega_{LO}$).

For instance, the first nitride layer may comprise $In_{x1}Al_{y1}Ga_{(1-x1-y1)}N$, while the second nitride layer may comprise $In_{x2}Al_{y2}Ga_{(1-x2-y2)}N$. The energy difference between respective energy steps ($h_2$) may be equal to or higher than an energy level of $\hbar\omega_{LO}$. In general, a semiconductor layer formed of InGaN may include a longitudinal optical phonon ($\hbar\omega_{LO}$) having an energy level of 74 to 84 meV depending upon In content. As a result, an energy difference between multiple steps in the nitride layer may be 74 meV or more. According to the inventive embodiments, such nitride layer may be provided in plural, and the number of layers is not particularly limited.

Each of the first, second and third well layers may comprise $In_{x3}Al_{y3}Ga_{(1-x3-y3)}N$. In this case, according to the inventive embodiments, x3=x2=x1 and y3<y2<y1, x3>x2>x1 and y3=y2=y1, or x3>x2>x1 and y3>y2>y1 may be defined. All these embodiments describe a structure having sequentially decreased energy band gaps. Although not illustrated in the foregoing embodiments, all structures composed of ingredients with desired constitutional composition to have sequentially decreased energy band gaps may be included in the present invention.

The first and second barrier layers 203 and 205, respectively, may have first nitride layers 230 and 260, second nitride layers 240 and 270, and third nitride layers 250 and 280.

An energy difference between respective nitride layers may be equal to or higher than an energy level of $\hbar\omega_{LO}$. For example, the first nitride layers 230 and 260 may comprise each $In_{x1}Al_{y1}Ga_{(1-x1-y1)}N$, the second nitride layers 240 and 270 may comprise each $In_{x2}Al_{y2}Ga_{(1-x2-y2)}N$, and the third nitride layers 250 and 280 may comprise each $In_{x3}Al_{y3}Ga_{(1-x3-y3)}N$. The energy difference between respective energy steps ($h_1$) may be equal to or higher than an energy level of $\hbar\omega_{LO}$. In this case, according to the inventive embodiments, x3=x2=x1 and y3<y2<y1, x3>x2>x1 and y3=y2=y1, or x3>x2>x1 and y3>y2>y1 may be defined. All these embodiments describe a structure having sequentially decreased energy band gaps. Although not illustrated in the foregoing embodiments, all structures composed of ingredients with desired constitutional composition to have sequentially decreased energy band gaps may be included in the present invention.

In general a semiconductor layer formed of InGaN may include a longitudinal optical phonon ($\hbar\omega_{LO}$) having an energy level of 74 to 84 meV depending upon indium (In) content. Accordingly, an energy difference between multiple steps of the nitride layer may be 74 meV or more.

Figure 4:
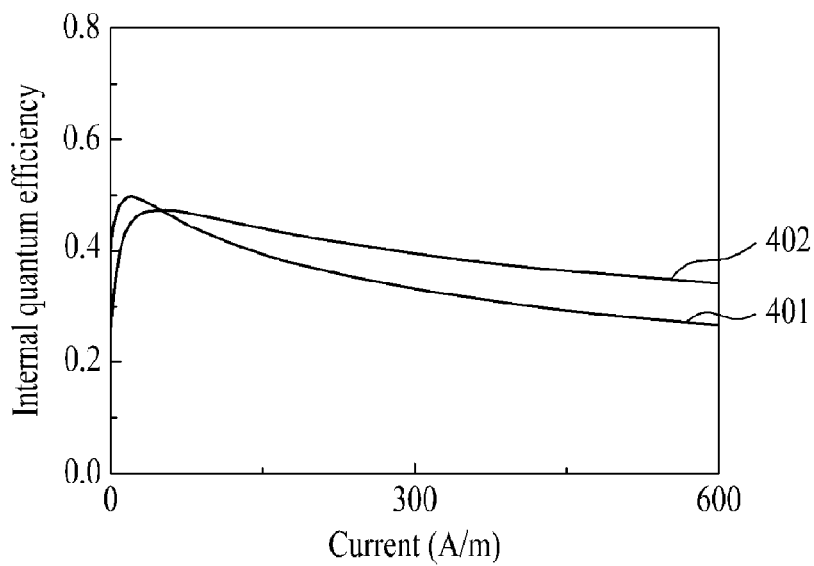
FIG. 4 shows internal quantum efficiency of a light emitting device according to one embodiment of the present invention.

FIG. 4 shows internal quantum efficiency of a light emitting device according to one embodiment of the present invention.

Referring to FIG. 4, it can be seen that the internal quantum efficiency 402 of a light emitting device according to the inventive embodiment is relatively higher, compared to the internal quantum efficiency 401 of a light emitting device according to conventional art.

Specifically, it was confirmed that, when high current is applied, the internal quantum efficiency 402 of the light emitting device according to the inventive embodiment is preferably improved, compared to the internal quantum efficiency 401 of the light emitting device according to the conventional art.

Figure 5:
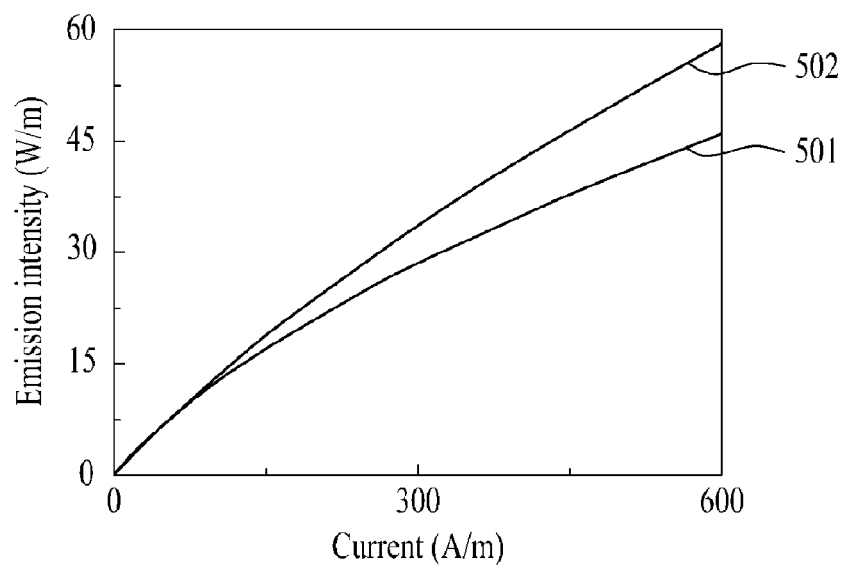
FIG. 5 shows emission intensity of a light emitting device according to one embodiment of the present invention.

FIG. 5 shows an emission intensity of a light emitting device according to one embodiment of the present invention.

Referring to FIG. 5, it can be seen that the emission intensity 502 of a light emitting device according to the inventive embodiment is relatively higher, compared to the emission intensity 501 of a light emitting device according to the conventional art.

Specifically, it was confirmed that, when high current is applied, the emission intensity 502 of the light emitting device according to the inventive embodiment is preferably improved, compared to the emission intensity 501 of the light emitting device according to the conventional art.

Figure 6:
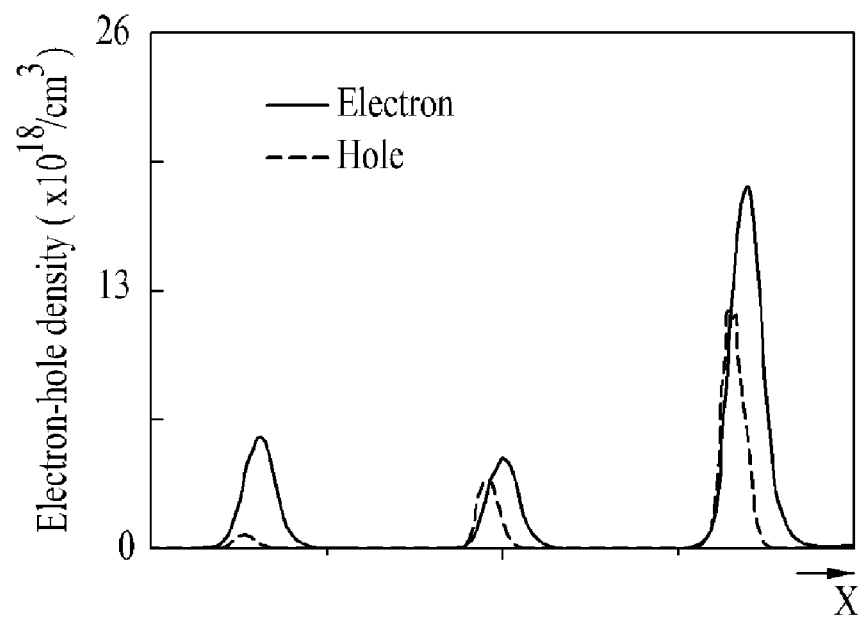
FIGS. 6 and 7 show carrier density of an active layer according to one embodiment of the present invention, compared to carrier density of an active layer according to the conventional art.
Figure 7:
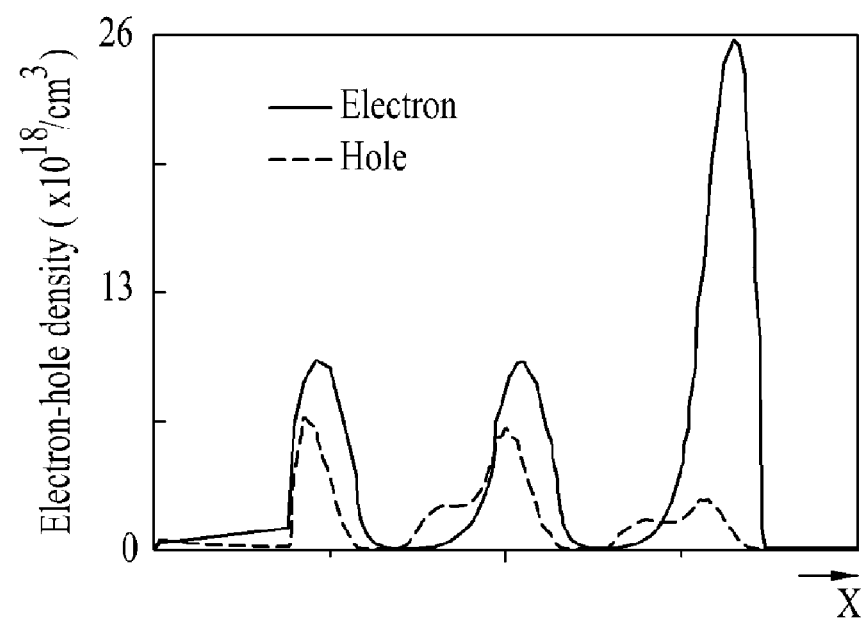

FIGS. 6 and 7 show a carrier density of an active layer according to one embodiment of the present invention, compared to a carrier density of an active layer according to the conventional art.

In particular, FIG. 6 shows a carrier density of an active layer according to the conventional art, while FIG. 7 shows a carrier density of an active layer according to the inventive embodiment.

Comparing both FIGS. 6 and 7, it can be seen that the carrier density of the active layer according to the inventive embodiment is uniformly increased in each well layer.

That is, the carrier density of each well layer in the active layer having MQW structure according to the inventive embodiment increases, compared to that of the active layer according to the conventional art. Therefore, it can be seen that electrons are not confined within each well layer and the electrons escaped due to leakage current are reduced.

Figure 8:
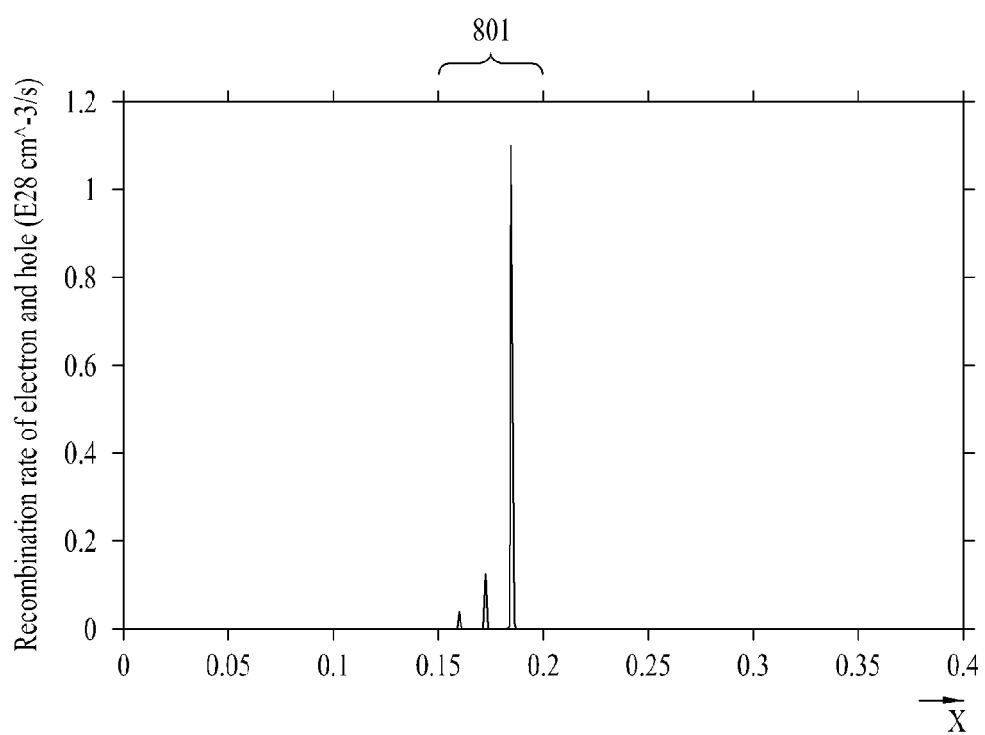
FIGS. 8 and 9 show a carrier (radiative) recombination rate of an active layer according to one embodiment of the present invention, compared to a carrier recombination rate of an active layer according to the conventional art.
Figure 9:
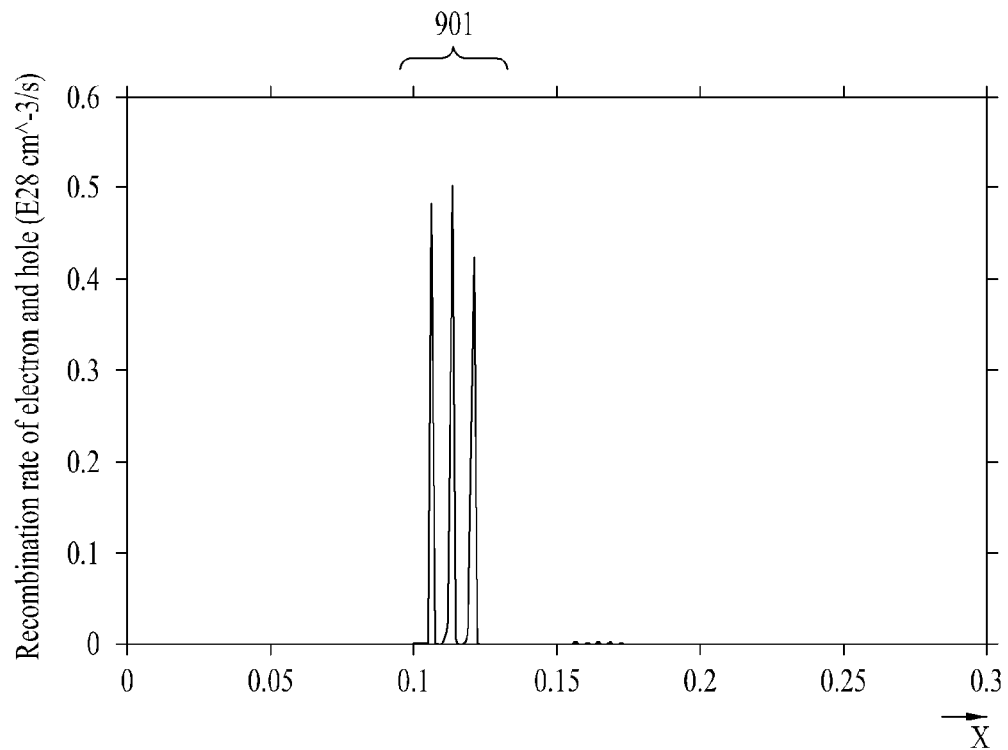

FIGS. 8 and 9 show a carrier recombination rate of an active layer according to one embodiment of the present invention, compared to a carrier recombination rate of an active layer according to the conventional art.

In particular, FIG. 8 shows a carrier recombination rate of an active layer according to the conventional art, while FIG. 9 shows a carrier recombination rate of an active layer according to the inventive embodiment.

Referring to FIG. 8, when high current is applied to the active layer, the carrier recombination rate is increased in the final well layer.

On the contrary, referring to FIG. 9, the active layer of a light emitting device according to the inventive embodiment exhibits a carrier recombination rate uniformly increased in each well layer, when high current is applied.

Figure 10:
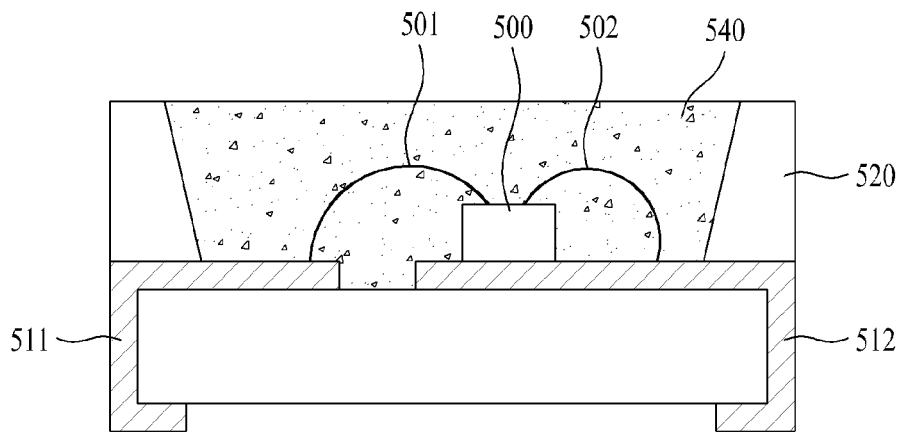
FIG. 10 illustrates a light-emitting device package according to one embodiment of the present invention.

FIG. 10 is a cross-sectional view illustrating a light-emitting device package according to one embodiment of the present invention.

As illustrated in the figure, the light-emitting device package according to the inventive embodiment may include a package body 520, first and second electrode layers 511 and 512 provided on the package body 520, the light emitting device 500 according to the foregoing embodiments, which is mounted on the package body 520 and electrically connected to both the first and second electrode layers 511 and 512, and a filler 540 surrounding the light emitting device 500.

The package body 520 may be made of silicone, synthetic resin and/or metal materials, and the light extraction efficiency may be improved by forming an inclined side around the light emitting device 500.

The first electrode layer 511 and second electrode layer 512 may be electrically isolated from each other, and a power supply may be provided on the light emitting device 500. The first and second electrode layers 511 and 512 may reflect light emitted by the light emitting device 500 to increase luminous efficacy and, in addition, serve to dissipate heat generated from the light emitting device 500.

The light emitting device 500 may be positioned on the package body 520 or, otherwise, mounted on either the first electrode layer 511 or the second electrode layer 512.

The light emitting device 500 may be electrically connected to both the first and second electrode layers 511 and 512 through wiring, a flip-chip form or die-bonding.

At least one of the light emitting devices described in the foregoing embodiments may be mounted alone or in plural on the light-emitting device package described above, without being particularly limited thereto.

The light-emitting device package according to the inventive embodiment may be arrayed in plural on a substrate and optical members such as a light guide plate, prism sheet, diffusion sheet or case may be arranged on a light path of the light-emitting device package. Such a light-emitting device package, substrate and/or optical member may serve as a light unit. In another embodiment, a display device, indicating device and/or lighting device having the light emitting device or the light-emitting device package disclosed in the foregoing embodiments may be realized. For example, the lighting device may include a lamp, a streetlamp, or the like.

According to the afore-mentioned embodiments, leakage current in an active layer is reduced, thereby increasing luminous efficacy of a light emitting device.

Figure 11:
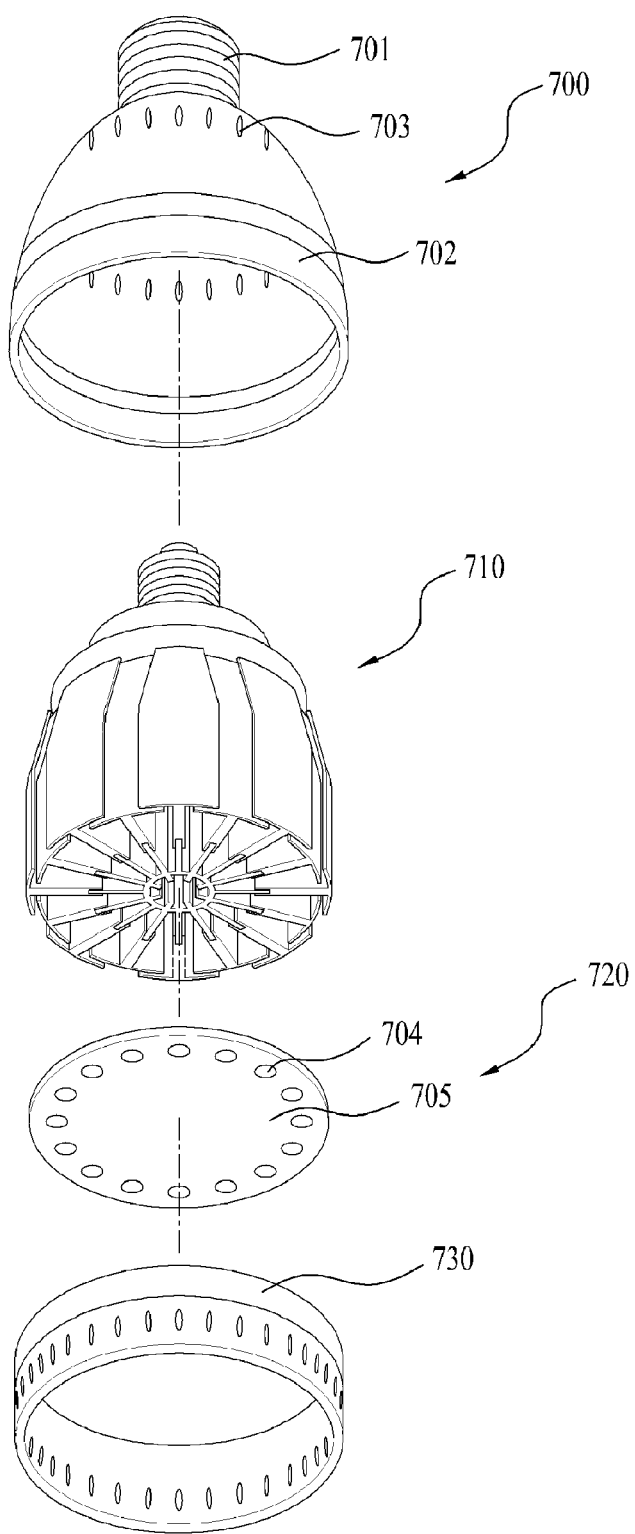
FIG. 11 is an exploded perspective view of a lighting apparatus including light emitting device packages in accordance with one embodiment.

FIG. 11 is an exploded perspective view of a lighting apparatus including light emitting device packages in accordance with one embodiment.

The lighting apparatus in accordance with this embodiment includes a light source 720 to project light, a housing 700 in which the light source 720 is installed, a heat dissipation unit 710 to dissipate heat generated by the light source 720, and a holder 730 to connect the light source 720 and the heat dissipation unit 710 to the housing 700.

The housing 700 includes a socket connector 701 connected to an electrical socket (not shown) and a body 702 connected to the socket connector 701 and accommodating the light source 720. One air flow hole 703 may be formed through the body 702.

In this embodiment, a plurality of air flow holes 703 is disposed on the body 702 of the housing 700. One air flow hole 703 may be formed, or plural air flow holes 703 may be disposed in a radial shape, in FIG. 6, or various other shapes.

The light source 720 includes a plurality of light emitting device packages 704 on a substrate 705. Here, the substrate 705 may have a shape which is capable of being inserted into an opening of the housing 700, and be formed of a material having high thermal conductivity so as to transfer heat to the heat dissipation unit 710, as described later.

The holder 730 is disposed under the light source 720. The holder 730 may include a frame and air flow holes. Further, although not shown in FIG. 11, optical members may be disposed under the light source 720 so as to diffuse, scatter or converge light emitted from the light emitting device packages 704 of the light source 720.

Figure 12A:
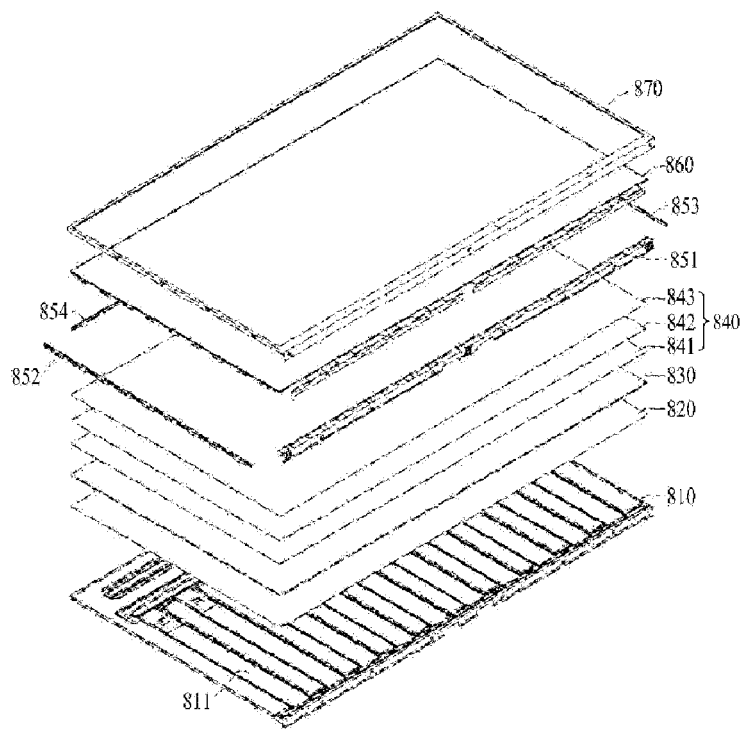
FIGS. 12A and 12B are views illustrating a backlight including light emitting device packages in accordance with one embodiment.
Figure 12B:
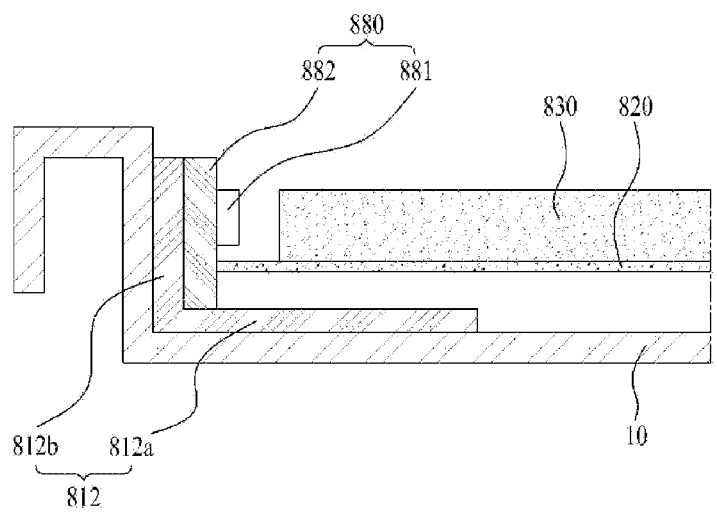

FIGS. 12A and 12B are views illustrating a backlight including light emitting device packages in accordance with one embodiment.

In FIGS. 12A and 12B, the backlight includes a bottom cover 810, a light emitting device package module (not shown) disposed at one side of the inside of the bottom cover 810, a reflective plate 820 disposed on the front surface of the bottom cover 810, a light guide panel 830 disposed in front of the reflective plate 820 to guide light emitted from the light emitting device package module to the front part of a display device, and optical members 840 disposed in front of the light guide panel 830. The display device including the backlight may further include, in addition to the above components, a liquid crystal display panel 860 disposed in front of the optical members 840, a top cover 870 disposed in front of the liquid crystal display panel 860, and fixing members 850 disposed between the bottom cover 810 and the top cover 870 to fix the bottom cover 810 and the top cover 870 together.

The light guide panel 830 serves to guide light emitted from the light emitting device package module (not shown) so as to convert the light into surface light. The reflective plate 820 disposed at the rear of the light guide panel 830 serves to reflect light emitted from the light emitting device package module (not shown) toward the light guide panel 830 so as to improve light efficiency.

The reflective plate 820 may be disposed as a separate component, in FIGS. 12A and 12B, or be disposed by coating the rear surface of the light guide panel 830 or the front surface of the bottom cover 810 with a material having high reflectivity.

Here, the reflective plate 820 may be formed of a material having high reflectivity and usable as an ultra-thin type, such as polyethylene terephthalate (PET).

Further, the light guide panel 830 scatters light emitted from the light emitting device package module so as to uniformly distribute the light throughout the entirety of a screen of the liquid crystal display device. Therefore, the light guide panel 830 is formed of a material having a high index of refraction and high transmittance, such as polymethylmethacrylate (PMMA), polycarbonate (PC) or polyethylene (PE).

The optical members 840 disposed on the light guide panel 830 diffuse light emitted from the light guide panel 830 by a designated angle. The optical members 840 enable light guided by the light guide panel 830 to be uniformly irradiated toward the liquid crystal display panel 860.

As the optical members 840, optical sheets, such as a diffusion sheet, a prism sheet and a protection sheet, may be selectively stacked, or a micro-lens array may be used. Here, a plurality of optical sheets may be used, and the optical sheets may be formed of a transparent resin, such as acrylic resin, polyurethane resin or silicon resin. Further, the prism sheet may include a phosphor sheet, as described above.

The liquid crystal display panel 860 may be disposed on the front surface of the optical members 840. Here, it will be apparent that, instead of the liquid crystal display panel 860, other kinds of display devices requiring a light source may be disposed.

FIG. 12B is a cross-sectional view of a light source part of the backlight.

In FIG. 12B, the reflective plate 820 is mounted on the bottom cover 810, and the light guide panel 830 is mounted on the reflective plate 820. Thereby, the reflective plate 820 may directly contact a heat dissipation member (not shown).

Printed circuit boards 881 to which light emitting device packages 882 are fixed may be bonded to a bracket 812. Here, the bracket 812 may be formed of a material having high thermal conductivity so as to discharge heat as well as to fix the light emitting device packages 882, and, although not shown in the drawings, heat pads may be disposed between the bracket 812 and the light emitting device packages 882 so as to facilitate heat transfer.

Further, the bracket 812 is disposed in an L shape, in FIG. 12B, a horizontal part 812a of the bracket 812 is supported by the bottom cover 810, and a vertical part 812a of the bracket 812 fixes the printed circuit boards 881.

As apparent from the above description, a light emitting device, a method of fabricating the same and a light emitting device package in accordance with one embodiment may be driven using AC power.

The features, structures and effects illustrated in the above embodiments may be included in at least one embodiment of the present invention but are not limited to one embodiment. Further, those skilled in the art will appreciate that various combinations and modifications of the features, structures and effects illustrated in the respective embodiments are possible. Therefore, it will be understood that these combinations and modifications are covered by the scope of the invention.

Although the embodiments of the present invention have been disclosed for illustrative purposes, those skilled in the art will appreciate that various modifications, additions and substitutions are possible, without departing from the scope and spirit of the invention as disclosed in the accompanying claims. For example, the respective elements described in detail in the embodiments may be modified. Further, it will be understood that differences relating to these modifications, additions and substitutions are covered by the scope of the invention defined in the accompanying claims.

What is claimed is:

1. A light emitting device, comprising a light emitting structure that includes a first conductive semiconductor layer, and active layer and a second conductive semiconductor layer:

wherein the active layer is provided between the first conductive semiconductor layer and the second conductive semiconductor layer, and includes a plurality of well layers and at least one barrier layer;

wherein the barrier layer includes a first nitride layer and a second nitride layer provided on the first nitride layer;

wherein the first nitride layer has a larger energy band gap than the second nitride layer while the energy band gap of the second nitride layer is larger than that of each well layer, wherein the first nitride layer comprises $In_{x1}Al_{y1}Ga_{(1-x1-y1)}N$, the second nitride layer comprises $In_{x2}Al_{y2}Ga_{(1-x2-y2)}N$, and the well layer comprises $In_{x3}Al_{y3}Ga_{(1-x3-y3)}N$, and In and Al compositions are defined by a first condition having x3=x2=x1 and y3<y2<y1, a second condition having x3>x2>x1 and y3=y2=y1, or a third condition having x3>x2>x1 and y3<y2<y1.

2. The light emitting device according to claim 1, wherein the first nitride layer is formed at the top of the active layer.

3. The light emitting device according to claim 1, wherein the barrier layer includes a plurality of nitride layers and an energy difference between respective nitride layers is equal to or higher than an energy level of a longitudinal optical phonon (($\hbar\omega_{LO}$)).

4. The light emitting device according to claim 3, wherein the energy difference between the respective nitride layers of the barrier layer is at least 74 meV.

5. The light emitting device according to claim 4, wherein the energy difference between the respective nitride layers of the barrier layer ranges from 74 to 83 meV.

6. The light emitting device according to claim 1, wherein a thickness of the barrier layer ranges from 1 to 5 nm.

7. The light emitting device according to claim 1, wherein the energy difference between the barrier layer and the well layer is at least $3K_BT$.

8. The light emitting device according to claim 7, wherein the energy difference between the barrier layer and the well layer is at least 90 meV.

9. The light emitting device according to claim 1, wherein the first nitride layer and the second nitride layer are formed adjacent to each other.

10. The light emitting device according to claim 1, wherein the energy band gaps of the first and second nitride layers in the barrier layer are sequentially narrowed as these nitride layers are closer to the first or second conductive semiconductor layer.

11. The light emitting device according to claim 1, wherein the barrier layer may comprise a plurality of nitride layers and these nitride layers have energy band gaps sequentially narrowed as they are nearer to the first or second conductive semiconductor layers.

12. A light emitting device, comprising a light emitting structure that includes a first conductive semiconductor layer, and active layer and a second conductive semiconductor layer:
wherein the active layer is provided between the first conductive semiconductor layer and the second conductive semiconductor layer, and includes a plurality of well layers and at least one carrier cooling layer formed adjacent to the first conductive semiconductor layer;
wherein the carrier cooling layer includes a first nitride layer and a second nitride layer provided on the first nitride layer;
wherein the first nitride layer has a larger energy band gap than the second nitride layer while the energy band gap of the second nitride layer is larger than that of each well layer,
wherein the first nitride layer comprises $In_{x1}Al_{y1}Ga_{(1-x1-y1)}N$, the second nitride layer comprises $In_{x2}Al_{y2}Ga_{(1-x2-y2)}N$, and the well layer comprises $In_{x3}Al_{y3}Ga_{(1-x3-y3)}N$, and
In and Al compositions are defined by a first condition having x3=x2=x1 and y3<y2<y1, a second condition having x3>x2>x1 and y3=y2=y1, or a third condition having x3>x2>x1 and y3<y2<y1.

13. The light emitting device according to claim 12, wherein the first nitride layer and the second nitride layer are formed adjacent to each other.

14. The light emitting device according to claim 12, wherein energy band gaps of the first and second nitride layers in the carrier cooling layer are sequentially narrowed as these nitride layers are nearer to the first or second conductive semiconductor layer.

15. The light emitting device according to claim 12, wherein the carrier cooling layer includes a plurality of nitride layers and these nitride layers have energy band gaps sequentially narrowed as they are nearer to the first or second conductive semiconductor layers.

16. The light emitting device according to claim 12, wherein the carrier cooling layer includes a plurality of nitride layers and an energy difference between respective nitride layers is equal to or higher than an energy level of a longitudinal optical phonon (($\hbar\omega_{LO}$)).

17. A lighting instrument, comprising:
a support substrate on which at least two light-emitting device packages, each having the light emitting device as set forth in claim 1, are provided; and
a case, at least a part of which is made of a light transmitting material, wherein light emitted from the light-emitting device package transmits through the light transmitting material.

18. The light emitting device according to claim 16, wherein the energy difference between the respective nitride layers to form the carrier cooling layer is at least 74 meV.

19. The light emitting device according to claim 16, wherein the energy difference between the respective nitride layers to for the carrier cooling layer ranges from 74 to 83 meV.

20. The light emitting device according to claim 12, wherein a thickness of the carrier cooling layer ranges from 1 to 5 nm.

* * * * *